(12) United States Patent
Nakanishi et al.

(10) Patent No.: US 6,656,759 B1
(45) Date of Patent: Dec. 2, 2003

(54) METHOD OF PRODUCING SEMICONDUCTOR ELEMENT, SEMICONDUCTOR ELEMENT, AND GYROSCOPE

(75) Inventors: Koichiro Nakanishi, Yokohama (JP); Takahiro Numai, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/572,834

(22) Filed: May 18, 2000

(30) Foreign Application Priority Data

| May 19, 1999 | (JP) | ............................................. | 11-138656 |
| May 19, 1999 | (JP) | ............................................. | 11-138657 |
| Sep. 14, 1999 | (JP) | ............................................. | 11-260237 |
| May 17, 2000 | (JP) | ..................................... | 2000-144944 |

(51) Int. Cl.$^7$ ......................... H01L 21/00; H01L 33/00; H01S 5/00
(52) U.S. Cl. .............................. 438/39; 257/95; 372/45
(58) Field of Search .................................. 438/670, 951, 438/39, 40; 372/45, 46; 257/95, 98

(56) References Cited

U.S. PATENT DOCUMENTS

| 5,426,658 | A | * | 6/1995 | Kaneno et al. ................ 372/45 |
| 5,559,053 | A | * | 9/1996 | Choquette et al. ............ 438/41 |
| 5,640,410 | A | * | 6/1997 | Yang ............................. 372/46 |
| 5,895,224 | A | * | 4/1999 | Park et al. ..................... 438/39 |

FOREIGN PATENT DOCUMENTS

| JP | 4-174317 | 6/1992 |
| JP | 8-250817 | 9/1996 |

* cited by examiner

Primary Examiner—W. David Coleman
(74) Attorney, Agent, or Firm—Fitzpatrick, Cella, Harper & Scinto

(57) ABSTRACT

A method of producing a semiconductor element is disclosed which comprises a step of preparing a semiconductor element member comprising a projection region on a substrate, a step of embedding an upper surface of the substrate, and upper and side surfaces of the projection region in a potting material, an exposure step of exposing the upper surface of the projection region, a deposition step of depositing an electrode material on the upper surface of the projection region, and a step of removing the potting material.

11 Claims, 18 Drawing Sheets

## METHOD OF PRODUCING SEMICONDUCTOR ELEMENT, SEMICONDUCTOR ELEMENT, AND GYROSCOPE

BACKGROUND OF THE INVENTION

1. Field of the Invention

The present invention relates to a method of producing a semiconductor element. More particularly, the invention concerns a method of producing a semiconductor element having such structure that an electrode is formed on an upper surface of a microscopic projection, such as ridge type semiconductor lasers, vertical cavity surface emitting lasers, or the like, used for optical communication, optical information processing, and so on. The invention also concerns a gyroscope produced using the method.

2. Related Background Art

In recent years, research has been conducted actively on surface emitting lasers from the aspect of capability of attaining low power consumption and high-density integration in the fields of optical communication and optical information processing. The typical size of such elements in in-plane directions is several $\mu$m to several ten $\mu$m in diameter, and the depth thereof is about several $\mu$m. A conventional production process of such semiconductor elements will be described below with reference to Japanese Patent Application Laid-Open No. 8-250817, as illustrated in FIGS. 20A to 20C.

As illustrated in FIG. 20A, a lower multilayer reflector (distributed Bragg reflector (DBR)) 403, a lower spacer layer 405, an active layer 404, an upper spacer layer 406, and an upper multilayer reflector 402 are grown on a substrate 407 by epitaxy such as metal organic chemical vapor deposition (MOCVD), molecular beam epitaxy (MBE), or the like. Further, a silicon dioxide ($SiO_2$) film 409 is formed on the upper multilayer reflector 402 by chemical vapor deposition (CVD).

Then, as illustrated in FIG. 20B, a circular resist pattern is formed on the $SiO_2$ film 409 by a known technique, such as photolithography, electron beam lithography, or the like, and reactive ion etching (RIE) is carried out using this resist pattern as an etching mask, thereby transferring the resist pattern to the $SiO_2$ film.

After that, the resist is removed with an oxygen plasma, and reactive ion beam etching (RIBE) is carried out using the $SiO_2$ film as an etching mask to etch the layers down to the substrate 407, thereby forming a cylindrical structure. Then, after wet etching is carried out to eliminate strain induced damage due to the RIBE, the substrate with the cylindrical structure is immersed in ammonium sulfide solution in which diphosphorus pentasulfide ($P_2S_5$) is dissolved, to form a passivation film on the side surface. Then a semiconductor thin film (not shown) is selectively grown on the side wall by MOCVD or the like.

Then, as illustrated in FIG. 20C, this cylindrical structure is embedded in polyimide 408 and the polyimide layer is etched with the oxygen plasma so as to expose the top part of the cylindrical structure. Then the $SiO_2$ film 409 is removed and an electrode 410 is formed by photolithography. In the last place, the back surface is polished and a back electrode (not shown) is formed thereon except for a light output portion.

The above-stated conventional technology, however, uses the photolithography process for forming the electrode 410 on the top part of the cylinder structure and thus necessitates alignment between the top part of the cylinder and the electrode. The size of these elements in the in-plane directions is extremely small, several $\mu$m or less in diameter, as stated previously, and thus the conventional technology required highly accurate alignment in order to form the electrode on only the upper surface of the projection.

Particularly, for integration of a plurality of elements on a flat basis, the alignment must be made with extremely high accuracy, which posed problems of decrease of yield, increase of production cost, and so on.

Meanwhile, it was common practice heretofore to form a passivation film in order to prevent oxidation of the side surface of the semiconductor elements. The passivation film on the upper surface of the electrode was removed for electric connection to the semiconductor element.

In the cases where the semiconductor elements were processed in a ridge shape or in a mesa shape, the photolithography was normally employed in order to remove the passivation film on the upper surface of the electrode.

However, the conventional photolithography methods required alignment between a photomask and the ridge or mesa shape. As the width of the ridge or mesa shape has been becoming narrower and narrower to below the micrometer order, relative positional deviation has become unignorable, which posed a problem that it was difficult to selectively remove the passivation film on the upper surface of the electrode.

SUMMARY OF THE INVENTION

An object of the present invention is to provide a method of producing a semiconductor element, by which an electrode can be formed readily on an upper surface of a microscopic projection.

Another object of the present invention is to provide a method of producing a semiconductor element, by which a passivation film can be formed readily on a side surface of a semiconductor element member having a projection region on a substrate.

Still another object of the present invention is to provide semiconductor elements produced by the above methods.

A method of producing a semiconductor element according to the present invention is a method comprising:
  a step of preparing a semiconductor element member comprising a projection region on a substrate;
  a step of embedding an upper surface of the substrate, and upper and side surfaces of the projection region in a potting material;
  an exposure step of exposing the upper surface of the projection region;
  a deposition step of depositing an electrode material on the upper surface of the projection region; and
  a step of removing the potting material.

Another method of producing a semiconductor element according to the present invention is a method comprising:
  a step of preparing a semiconductor element member comprising a projection region on a substrate;
  a step of forming a first passivation film on an upper surface of the substrate, and upper and side surfaces of the projection region;
  a step of forming a second passivation film on the first passivation film;
  an exposure step of removing the second passivation film on the upper surface of the projection region to expose the first passivation film;

a step of removing the first passivation film on the upper surface of the projection region; and a step of removing the second passivation film remaining on the upper surface of the substrate.

Still another method of producing a semiconductor element according to the present invention is a method comprising:

a step of preparing a semiconductor element member comprising a projection region on a substrate;

a step of forming a passivation film on an upper surface of the substrate, and upper and side surfaces of the projection region;

a step of embedding the upper surface of the substrate, and the upper and side surfaces of the projection region in a potting material;

an exposure step of exposing the passivation film on the upper surface of the projection region;

a step of removing the passivation film on the upper surface of the projection region;

a deposition step of depositing an electrode material on the upper surface of the projection region; and a step of removing the potting material.

DESCRIPTION OF THE PREFERRED EMBODIMENTS

The present invention will be described below in detail with reference to the attached drawings.

The present invention can be applied to any structure having a projection of either the mesa shape or the ridge shape.

Embodiment 1

Method of Forming Electrode on Upper Surface of Projection

Figure 1A:
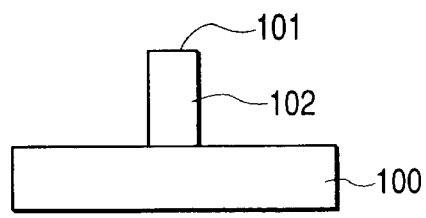
FIGS. 1A, 1B, 1C, 1D, 1E, 1F, 1G and 1H are schematic, cross-sectional views for explaining a first embodiment of the present invention.

The first step is to prepare a member having a projection 102 of a desired height on a substrate 100, as illustrated in FIG. 1A. Numeral 101 designates an upper surface of the projection 102.

Figure 1B:
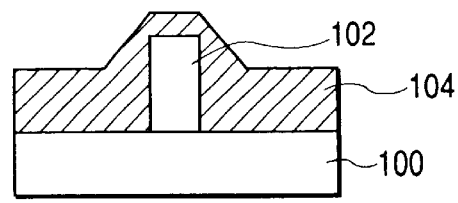

Then, as illustrated in FIG. 1B, the projection is embedded in a potting material 104 such that the potting material on the upper surface of the projection is thinner than that on the other portions. Specifically, the embedding is effected by spin coating of a resin or the like. On this occasion, the thickness of the potting material coating on the flat part does not have to be greater than the height of the projection and it is only necessary that the thickness of the potting material on the upper surface of the projection is sufficiently smaller than the thickness of the organic compound on the other flat portions and that the thickness of the potting material on the flat portions is enough to implement the post step of liftoff of an electrode material.

Figure 1C:
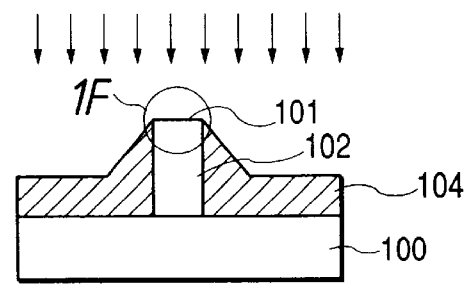

Next, the potting material layer is etched uniformly from the top to expose the upper surface 101 of the projection, as illustrated in FIG. 1C.

Figure 1D:
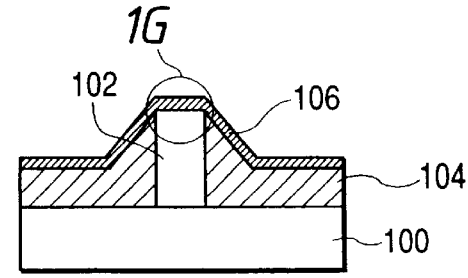

Then, an electrode material 106 is deposited over the entire surface of the substrate with the upper surface 101 of the projection being exposed, as illustrated in FIG. 1D. Techniques for the deposition of the electrode material include sputtering, evaporation, and so on, and it is desirable to select a deposition technique with as little throwing power as possible.

Figure 1E:
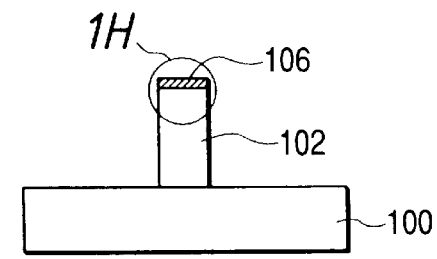

After the deposition of the electrode material, the so-called lift-off procedure is then carried out to remove the electrode material deposited on the portions other than the upper surface of the projection together with the potting material, as illustrated in FIG. 1E. Specifically, this procedure is carried out, for example, by dissolution removal of the potting material by ultrasonic cleaning in an organic solvent or the like.

The above steps make it possible to form the structure having the electrode on the upper surface of the projection by the so-called self-alignment procedures, without the need for highly accurate alignment.

The preferred potting materials for embedding the projection 102 include those materials which are suitable for the spin coating. When the projection is embedded by the spin coating using the potting materials suitable therefor, such as photoresists etc., the thickness of the potting material on the upper surface of the projection becomes smaller than the thickness of the potting material on the other regions.

Figure 1F:
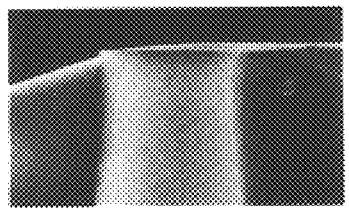
Figure 1G:
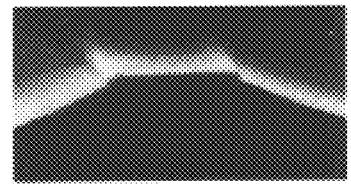
Figure 1H:
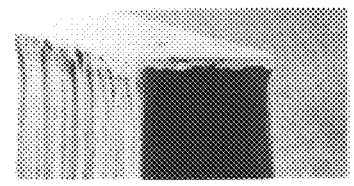

When plasma etching is employed as a technique for exposing the upper surface of the projection as illustrated in FIG. 1C, the upper surface of the projection can be exposed by simply controlling only the time of etching. FIGS. 1F, 1G, and 1H are enlarged photographs of the regions inside the circles in FIGS. 1C, 1D, and 1E, respectively.

It is noted that in the present embodiment the potting material for embedding the projection may be an organic compound. The etching of the potting material can be conducted safely and readily by using an organic compound, such as a photoresist or the like, as the aforementioned spin-coat-ready potting material and employing the so-called ashing procedure with the oxygen plasma to ash and remove the organic compound such as the photoresist or the like, as an etching method with a plasma.

Since the present invention allows the above procedures to be implemented by use of the materials, systems, and techniques conventionally used, such as the photoresists, ashing with the oxygen plasma, and so on, it does not require new equipment investment or the like.

Methods available for the formation of the projection include highly anisotropic dry etching, for example, such as reactive ion etching (RIE) or reactive ion beam etching (RIBE) or the like. When the projection is formed in a stripe shape as in the ridge lasers, it can also be formed by wet etching, by selecting an appropriate direction of the stripe relative to the substrate and an appropriate etchant.

Embodiment 2

Method of Forming Passivation Film on Side Surface of Projection

Figure 2A:
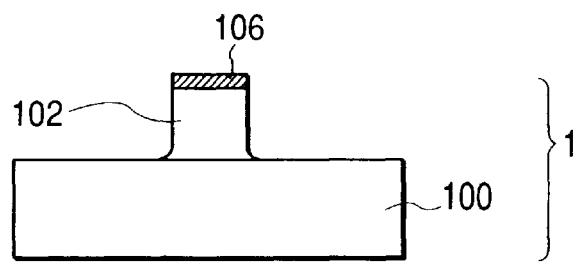
FIGS. 2A, 2B, 2C, 2D, 2E and 2F are schematic, cross-sectional views for explaining a second embodiment of the present invention.

First prepared is a semiconductor element member 1 having the electrode 106 on the upper surface of the projection 102 (FIG. 2A). Numeral 100 designates a semiconductor substrate. It is needless to mention that the present invention can also be applied to semiconductor element members in which the electrode 106 is not formed.

Figure 2B:
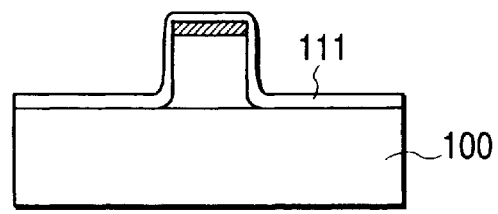

Then, a first passivation film 111 is formed on the upper surface and side surface of the semiconductor element member (FIG. 2B). As the first passivation film, dielectric films ($SiO_2$, MgO, $SiN_x$, etc.) can be suitably used. In the cases where the semiconductor element member 1 is formed over an entire surface of a wafer as a substrate, the first passivation film 111 may also be formed over the entire surface of the wafer.

Figure 2C:
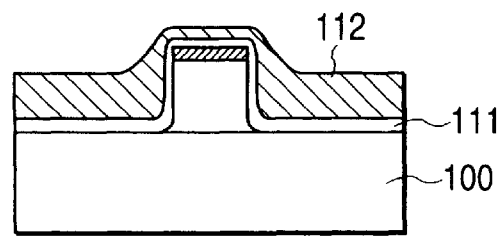

Then, a second passivation film 112 is formed on the first passivation film 111, as illustrated in FIG. 2C.

At this time, it is desirable to make the second passivation film on the upper surface of the semiconductor element member thinner than that on the other regions. For example, the second passivation film 112 is formed by spin coating. As the materials for the second passivation film, there are included resins, for example, photoresists, but there are no restrictions on the materials as long as the resultant film can provide sufficient protection for the semiconductor member; for example, the materials can be resins resulting from removal of a photosensitizer from the photoresists.

Figure 2D:
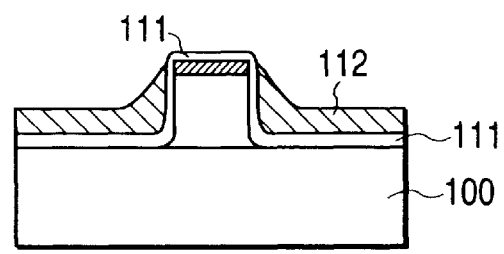

Then, the second passivation film 112 is removed so as to selectively expose the first passivation film 111 on the upper surface of the semiconductor element member, as illustrated in FIG. 2D.

When this removal is carried out by etching, the second passivation film 112 above the electrode 106 can be removed selectively by etching the whole of the second passivation film utilizing the difference in thickness of the second passivation film 112 between in the upper surface area of the electrode 106 and in the other regions.

Figure 2E:
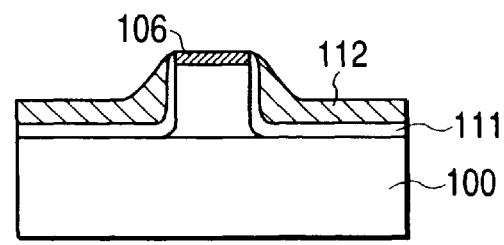

Next, the first passivation film 111 thus exposed is removed as illustrated in FIG. 2E. After that, the second passivation film 112 remaining on the upper surface of the substrate 100 and on the side surface of the projection region is removed as the occasion demands.

Figure 2F:
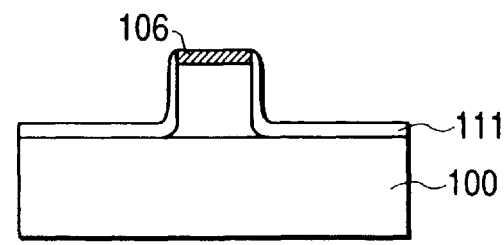

In this way the passivation film can be formed selectively on the side surface of the semiconductor element member, as illustrated in FIG. 2F.

Figure 4A:
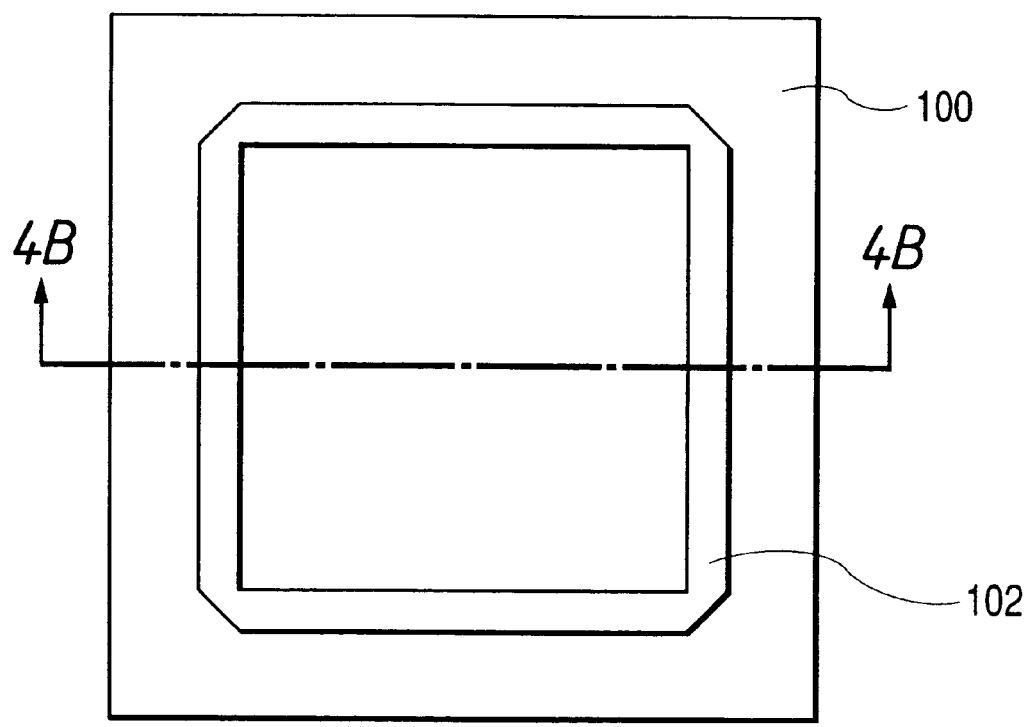
FIGS. 4A and 4B are views for explaining a semiconductor element member according to the present invention.
Figure 4B:
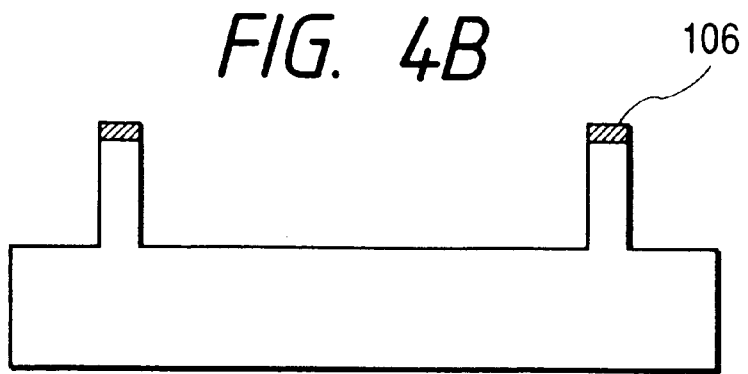
Figure 5A:
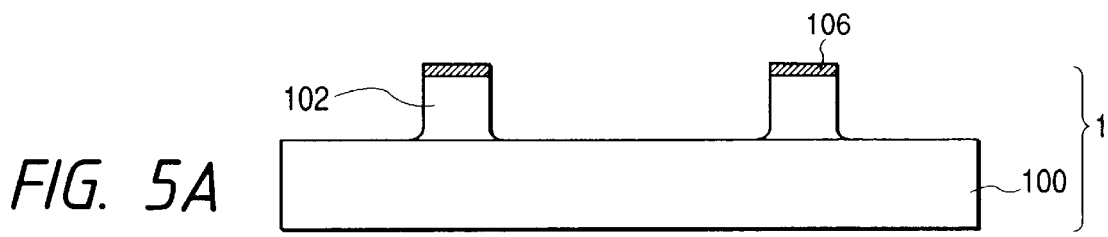
FIGS. 5A, 5B, 5C, 5D, 5E and 5F are views for explaining a semiconductor element member according to the present invention.
Figure 5B:
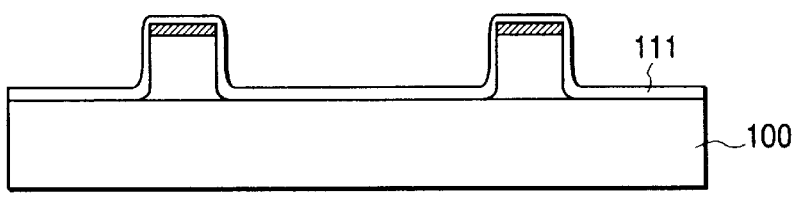
Figure 5C:
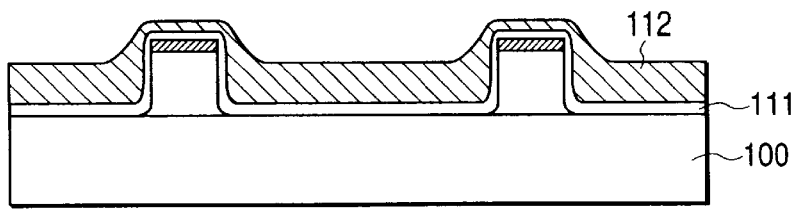
Figure 5D:
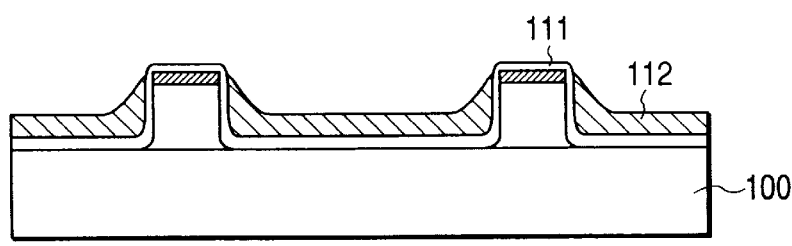
Figure 5E:
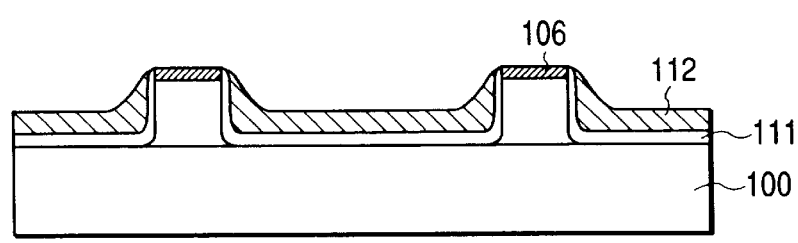
Figure 5F:
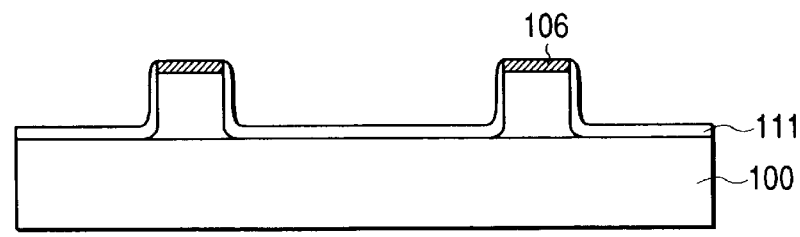

The shape of the semiconductor element member may be a ring-shaped ridge structure as illustrated in FIGS. 4A and 4B. FIG. 4B is a sectional view along a line 4B—4B in FIG. 4A.

When the semiconductor element member is of the ring-shaped ridge structure as illustrated in FIGS. 4A and 4B, the passivation film is formed through a passivation film forming method (steps illustrated in FIGS. 5A to 5F) similar to that described in the present embodiment.

As described above, by utilizing the thickness distribution generated in the formation of the second passivation film 112 by spin coating, the first passivation film 111 can be formed selectively without the exposure and development steps. Namely, the method of the present embodiment obviates the problem of need for the alignment between the photomask and the mesa or ridge, which is posed in the exposure step.

Moreover, in FIG. 2F, an electrode layer may further be formed on the first passivation film 111 and on the upper surface of the projection (including the case where the electrode 106 is not formed).

The above describes (1) the electrode forming method on the upper surface of the projection in Embodiment 1 and (2) the passivation film forming method on the side surface of the projection in Embodiment 2, but it is also preferable, of course, to apply the both of the process of (1) and the process of (2) to the method of producing the semiconductor element.

Described next is the third embodiment of forming the electrode on the upper surface of the projection and the passivation film on the side surface thereof.

Embodiment 3

Figure 3A:
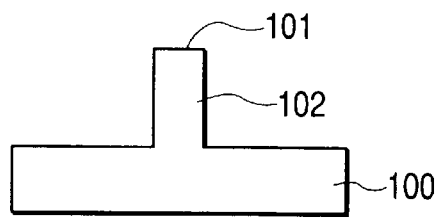
FIGS. 3A, 3B, 3C, 3D, 3E, 3F and 3G are schematic, cross-sectional views for explaining a third embodiment of the present invention.

The first step is to prepare a member having the projection 102 of a desired height on the substrate 100, as illustrated in FIG. 3A.

Figure 3E:
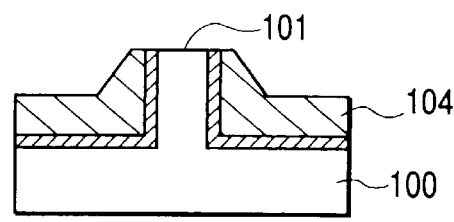
Figure 3B:
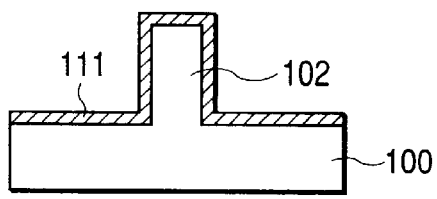

Then, the passivation film 111 is formed so as to cover the whole of the projection 102, as illustrated in FIG. 3B. As the passivation film 111, there can be used, for example, $SiO_2$, $SiN_x$, or the like.

Figure 3F:
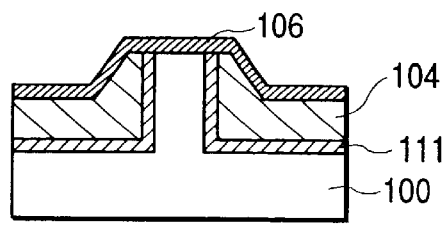
Figure 3C:
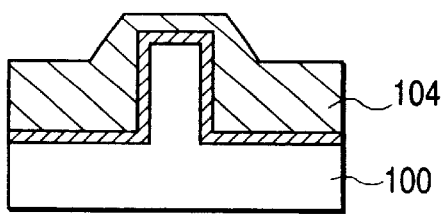

Then, the projection is embedded so that the film on the upper surface 101 of the projection is thinner than that on the other portions, as illustrated in FIG. 3C. Numeral 104 designates the potting material.

Figure 3G:
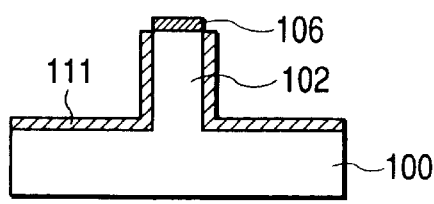
Figure 3D:
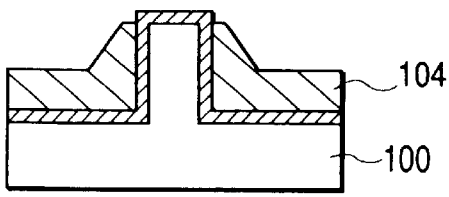

Then, the potting material 104 is etched uniformly from the top to expose the passivation film 111 on the upper surface of the projection, as illustrated in FIG. 3D. As the etching method, there can be utilized, for example, RIE or the like.

After that, the passivation film 111 thus exposed is subjected to etching to expose the semiconductor layer at the upper surface 101 of the projection, as illustrated in FIG. 3E. The RIE can also be applied to this etching procedure of the passivation film 111.

Then, the electrode material 106 is deposited over the entire surface with the semiconductor layer being exposed at the upper surface of the projection, as illustrated in FIG. 3F. As the deposition method, there can be used evaporation or sputtering.

After completion of the deposition of the electrode material, the so-called lift-off procedure is then carried out to remove the electrode material deposited on the regions other than the upper surface of the projection together with the potting material 104, as illustrated in FIG. 3G.

Incidentally, an electrode layer may be formed on the electrode material 106 and the passivation film 111 as the occasion demands.

Since the above steps exclude the exposure and development steps by utilizing the thickness distribution generated in spin coating of the potting material, the method of the present embodiment makes it possible to form the microscopic projection structure in which the electrode is on the upper surface and in which the passivation film 111 protects the side surface of the semiconductor layer, by the so-called self-alignment procedures without the need for highly accurate alignment.

In the present embodiment the passivation film covering the projection may also be formed by chemical vapor deposition or by sputtering.

By forming the passivation film as a protective film by a film forming method with good coverage, such as CVD, sputtering or the like, it is possible to perfectly cover the projection including the side surface thereof.

If a technique utilizing a plasma, such as the RIE or the like, is employed as a technique for exposing the passivation film on the upper surface of the projection as illustrated in FIG. 3D, the state illustrated in FIG. 3D can be attained by controlling only the time of etching.

Similarly, when the technique utilizing a plasma, such as the RIE or the like is used, the state of the semiconductor layer exposed only at the upper surface of the projection, illustrated in FIG. 3E, can also be attained by selectively removing only the exposed passivation film with simply controlling only the time of etching.

As described above, the electrode can be formed on the upper surface of the microscopic projection by self-alignment, using only the conventionally available technologies, such as the spin coating of the organic compound, the RIE, and so on.

EXAMPLES

The following examples are given for the purpose of illustration and not by way of limitation.

Example 1

The first example of the present invention described below is an example in which a ridge laser was produced using a semiconductor laser substrate having a stack of InP and InGaAsP layers.

Prepared was a semiconductor substrate having an n-InP cladding layer 202, an InGaAsP guiding layer 204, a non-doped multiple quantum well (MQW) active layer 206 consisting of InGaAsP and InGaAs, a p-InGaAsP guiding layer 208, a p-InP cladding layer 210, and a p-InGaAsP cap layer 212 in the stated order on an n-InP substrate 200. The semiconductor substrate can be fabricated, for example, by epitaxially growing each of the layers by use of the metal organic vapor phase epitaxy (MOVPE). A positive photoresist containing a novolak resin as a main component was applied onto the laser substrate by spin coating and a resist mask 214 of a stripe shape having the width of 5 μm and the height of 1.5 μm was formed by photolithography (FIG. 6A).

Figure 6A:
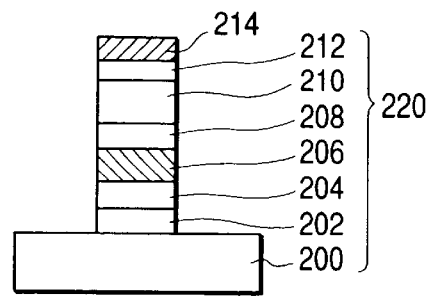
FIGS. 6A, 6B, 6C, 6D, 6E, 6F, 6G and 6H are views for explaining a first example.

Then, dry etching is carried out using this etching mask 214 to form a semiconductor element member 220, as illustrated in FIG. 6A. In the present example the etching was carried out using a reactive ion beam etching (RIBE) system with the electron cyclotron resonance (ECR) plasma as an etching system and using chlorine gas as an etching gas. After an etching chamber of the ECR-RIBE system was evacuated down to the vacuum of $3 \times 10^{-6}$ Pa by a turbo molecular pump, the etching was carried out under the flow of chlorine gas at 3 sccm and under the conditions of the pressure of $1 \times 10^{-2}$ Pa in the chamber, the ECR plasma power of 200 W, the substrate temperature of 280° C., and the acceleration voltage of 650 V.

These etching conditions were selected as conditions capable of attaining the etching shape with high verticality of the InP-based compound semiconductors.

Under these conditions the etching was carried on to etch the layers including the n-InP cladding layer 202, thereby forming a ridge. At this time the height of the ridge was approximately 2 μm. Incidentally, the method, conditions, etc. of the dry etching do not have to be limited to those described in the present example, but may be selected properly according to the materials to be etched, a device to be fabricated, and so on.

Figure 6B:
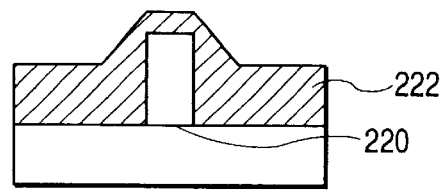

Next, as illustrated in FIG. 6B, after the resist mask 214 for the dry etching was removed by ashing with an oxygen plasma, a negative resist 222 consisting of a polyvinylphenol resin and a bis azido compound was applied onto the entire surface by spin coating at 3000 rpm with a spinner, and heating at 80° C. for five minutes was carried out by use of a hot plate to vaporize the solvent of the photoresist, thereby embedding the projection.

Figure 6C:
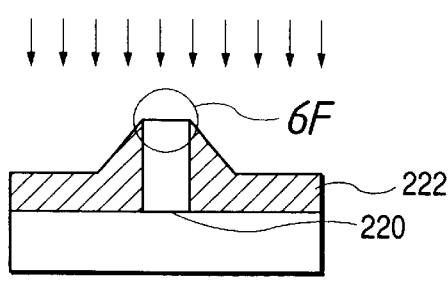

Then, the photoresist was partly removed so as to expose only the upper surface of the projection by ashing with an oxygen plasma and under the ashing conditions of the etching pressure of 3 Pa and the RF power of 130 W for three minutes, as illustrated in FIG. 6C. The surface of the sample was observed with an optical microscope and it was confirmed thereby that the upper surface of the ridge was exposed almost perfectly.

Figure 6D:
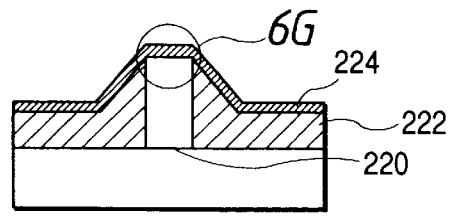
Figure 6E:
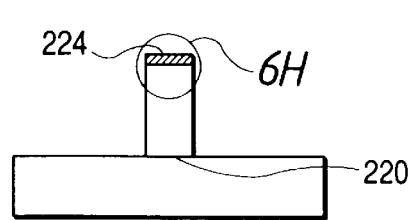
Figure 6F:
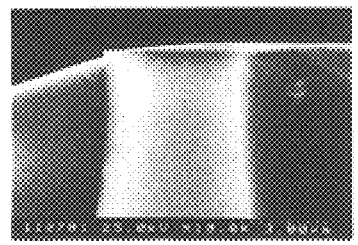

FIG. 6F shows the observation results of the vicinity of the ridge top in this state with a scanning electron microscope (SEM). It is clearly seen that only the upper surface of the ridge is exposed and the other portions are embedded in the resist.

Figure 6G:
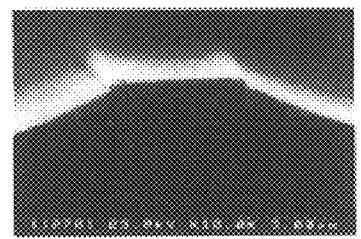

Then, titanium and gold as an electrode material 224 were deposited in the thickness of 10 nm and in the thickness of 100 nm, respectively, in the stated order over the entire surface by electron beam evaporation, as illustrated in FIG. 6D. FIG. 6G shows the observation results in this state with the scanning electron microscope (SEM).

Then, when this sample was immersed in acetone and subjected to ultrasonic cleaning for five minutes, the photoresist 222 covering the ridge was peeled off completely, so that the electrode material was removed all from the portions other than the region above the ridge, as illustrated in FIG. 6E.

Figure 6H:
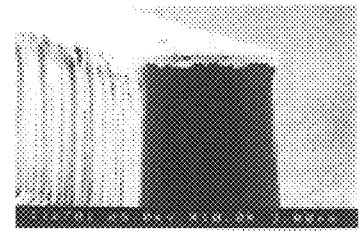

FIG. 6H shows the observation results in this state with the scanning electron microscope (SEM). It can be confirmed that the electrode is formed only on the upper surface of the ridge. It was also confirmed that overhangs of the electrode onto the ridge side surface at this time were not more than 500 nm and did not constitute any leak path on the side surface of the ridge.

In the final step, a titanium film of 50 nm in thickness and a gold film of 500 nm in thickness were formed as an electrode on the back surface by electron beam evaporation, thereby completing the element.

Example 2

FIGS. 7A to 7E show an example in which a surface emitting laser was produced, as the second example of the present invention.

Figure 7A:
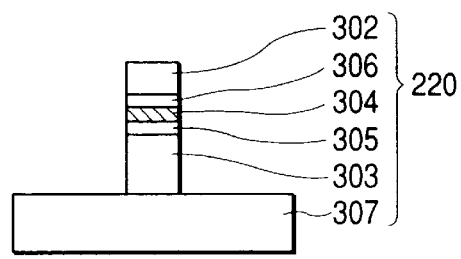
FIGS. 7A, 7B, 7C, 7D and 7E are views for explaining a second example.

In the first step the semiconductor element member 220 having the cylindrical structure of the diameter of 10 μm was formed by the known procedures, as illustrated in FIG. 7A. In this structure numeral 307 designates a substrate, 303 a lower multilayer reflector, 305 a spacer layer, 304 an active layer, 306 a spacer layer, and 302 an upper multilayer reflector. At this time the height of the cylinder was approximately 4 μm.

Figure 7B:
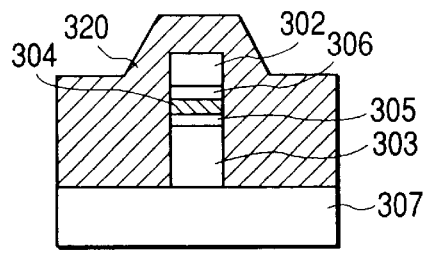

After the formation of the semiconductor element member 220 having the cylindrical structure, the cylindrical structure was then embedded in a manner similar to that in Example 1, by applying the negative photoresist 320 consisting of the polyvinylphenol resin and the bis azido compound onto the entire surface by spin coating at the rotational speed of 2000 rpm with the spinner and heating it at 80° C. for five minutes by the hot plate to vaporize the solvent of the photoresist, as illustrated in FIG. 7B.

Figure 7C:
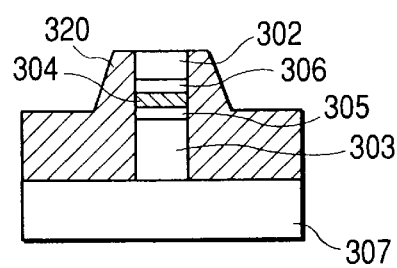

Then, the photoresist was partly removed so as to expose only the upper surface of the projection by ashing with an oxygen plasma, as illustrated in FIG. 7C. The ashing was carried out under the conditions of the etching pressure of 3 Pa and the RF power of 130 W for five minutes to expose the top part of the cylinder.

Figure 7D:
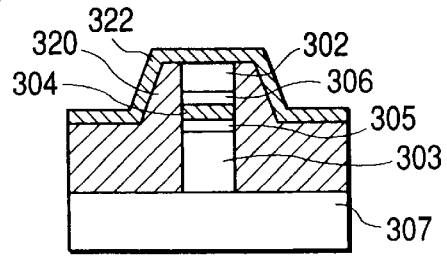

Then, Cr and Au as an electrode material 322 were deposited in the thickness of 50 nm and in the thickness of 500 nm, respectively, on the entire surface by electron beam evaporation, as illustrated in FIG. 7D.

Figure 7E:
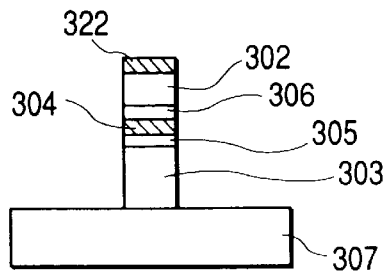

Then, when this sample was immersed in acetone and subjected to ultrasonic cleaning for ten minutes, the photoresist was peeled off perfectly, so that the electrode material was removed all from the portions other than the top part of the cylinder, as illustrated in FIG. 7E.

In the final step, an electrode was formed on the back surface except for the light output portion, thus completing the element.

Example 3

FIGS. 8A to 8F are views for explaining a method of producing a passivation film of a semiconductor optical element processed in the ridge or mesa shape. In the figures, numeral 400 designates a semiconductor substrate, 422 a buffer layer, 423 a guiding layer, 424 an active layer, 425 a guiding layer, 426 a cladding layer, 427 a cap layer, 428 an electrode, 430 a first passivation film, and 431 a resin as a second passivation film.

The passivation film forming method according to the present invention will be described with reference to FIGS. 8A to 8F.

Figure 8A:
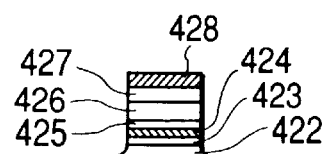
FIGS. 8A, 8B, 8C, 8D, 8E and 8F are views for explaining a third example.

First prepared was a wafer for semiconductor laser processed in the ridge or mesa-shape, as illustrated in FIG. 8A. The semiconductor layer was comprised of the InP buffer layer 422 (0.05 μm thick), the undoped InGaAsP guiding layer 423 (0.15 μm thick) of the 1.3 μm composition, the undoped InGaAsP active layer 424 (0.1 μm thick) of the 1.55 μm composition, the undoped InGaAsP guiding layer 425 (0.15 μm thick) of the 1.3 μm composition, the p-InP cladding layer 426 (2 μm thick), and the p-InGaAsP cap layer 427 (0.3 μm thick) of the 1.4 μm composition, which were grown on the n-InP substrate 400 (350 μm thick) by metal organic vapor phase deposition.

Then, the electrode 428 was formed on the cap layer 427.

Figure 8B:
Figure 8C:
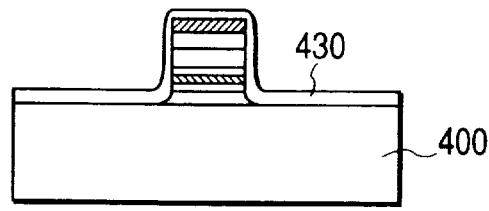

Next, a silicon nitride film was formed as a passivation film 430 over the entire surface of the wafer, as illustrated in FIG. 8B. After that, a resin 431 was laid so as to cover the whole of the passivation film 430 by spin coating. At this time, the resin 431 has a property of filling the depressed portions so as to make the surface flatter. This state is illustrated in FIG. 8C.

Figure 8D:
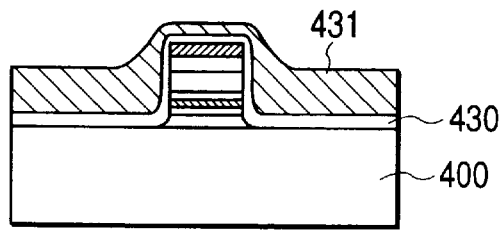
Figure 8E:
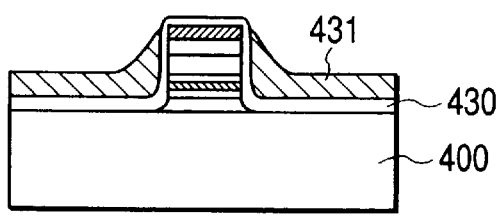

Namely, the thickness of the resin 431 on the mesa or the ridge was smaller than that of the resin 431 in the depressed portions. In this example the resin 431 employed was the photoresist RD-2000N (available from Hitachi Chemical Co., Ltd.). The resin 431 was baked at 80° C. for thirty minutes and thereafter removed partly by ashing with an oxygen plasma so as to expose only the passivation film 430 on the electrode 428, as illustrated in FIG. 8D. Then, only this exposed passivation film 430 was removed by etching. This state is illustrated in FIG. 8E. In this example, buffered HF (hydrofluoric acid) was used for removing the silicon nitride film as the passivation film 430.

Figure 8F:
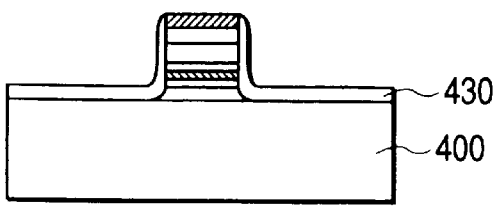

Finally, the remaining resin 431 was removed, thereby completing the selective formation of the passivation film 430. FIG. 8F is a cross-sectional view of the wafer after the removal of the resin 431. In this example the resin 431 was removed by the plasma ashing with oxygen, but it may also be removed with a photoresist remover.

Incidentally, in order to allow the element to act as a semiconductor optical element, an electrode needs to be formed further on the substrate side. However, since this example concerns only the method of forming the passivation film, no description is provided for formation of the electrode on the substrate side. An example of the semiconductor optical element is an optical gyroscope using a semiconductor laser. Specifically, it is described in detail in Japanese Patent Application Laid-Open No. 4-174317.

Figure 9:
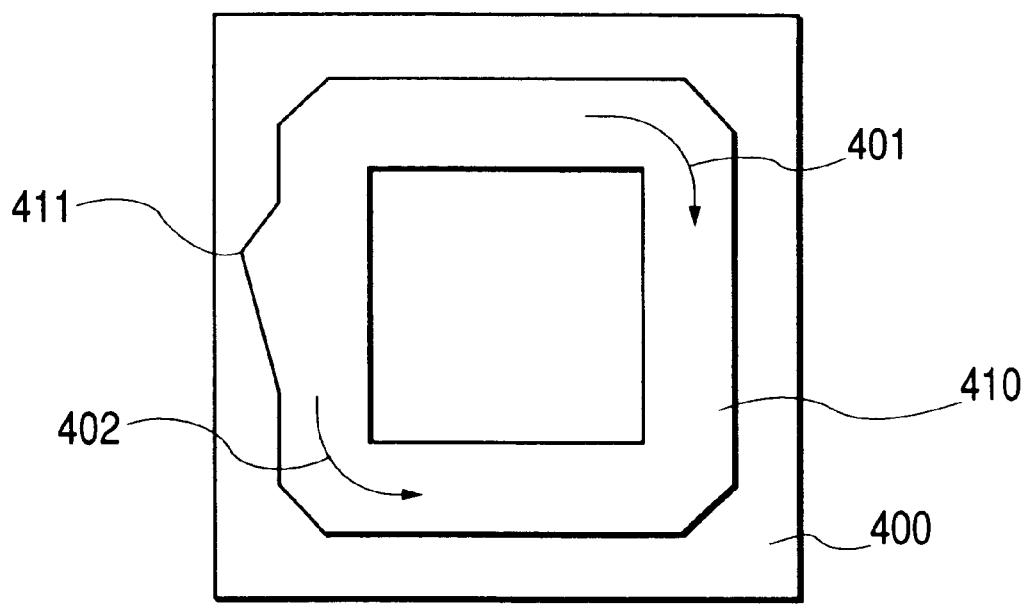
FIG. 9 is a diagram showing an example of the shape of a semiconductor ring laser according to the present invention.

When the semiconductor laser is formed in the ring-shaped ridge structure having a waveguide 410, as illustrated in FIG. 9, the electrode is provided on the back surface, and variations are detected in voltage, current, or impedance of a beat signal caused by the difference in oscillation frequencies of clockwise rotating light and counterclockwise rotating light with rotation of the device, at the electrode 428, an angular velocity can be measured. Namely, the gyroscope can be fabricated.

The materials for the semiconductor layer, electrode, passivation film, and resin can be any materials that can exhibit their respective functions, without having to be limited to the above materials.

When a threshold value is exceeded, there appear clockwise and counterclockwise rotating beams 401, 402 (of the wavelengths $\lambda_1$, $\lambda_2$) inside the laser.

As long as the semiconductor ring laser is kept at a standstill, $\lambda_1 = \lambda_2$. However, once the gyroscope equipped with the laser is exposed to a clockwise or counterclockwise angular velocity, the wavelengths in the two directions will become different from each other. Then the difference between frequencies corresponding to the difference between the oscillation wavelengths can be detected from variations in the voltage of the beat signal.

Of course, the beat signal can also be detected as variations in current or impedance.

Further, if the waveguide 410 of the semiconductor ring laser is shaped in the structure having an asymmetric taper region 411, as illustrated in FIG. 9, there will occur the difference between oscillation wavelengths even in a standstill state and there will exist the beat frequency corresponding to the difference. Therefore, where the device is placed under an angular velocity, not only the angular velocity, but also whether clockwise or counterclockwise rotation, can be detected by calculating a deviation from the beat frequency in the standstill state. In FIG. 9, numerals 401, 402 denote the clockwise and counterclockwise rotating beams, respectively. Numeral 400 designates the substrate.

In the present example the semiconductor materials were the InGaAsP base materials, but they may also be selected from the GaAs base, ZnSe base, InGaN base, Al—GaN base materials, and so on. The optical path may also be formed so as to surround any shape, not only the rectangular shape as illustrated in FIG. 4A or FIG. 9, but also a polygon such as a hexagon, a triangle or the like, or a circle, or the like.

Figure 12:
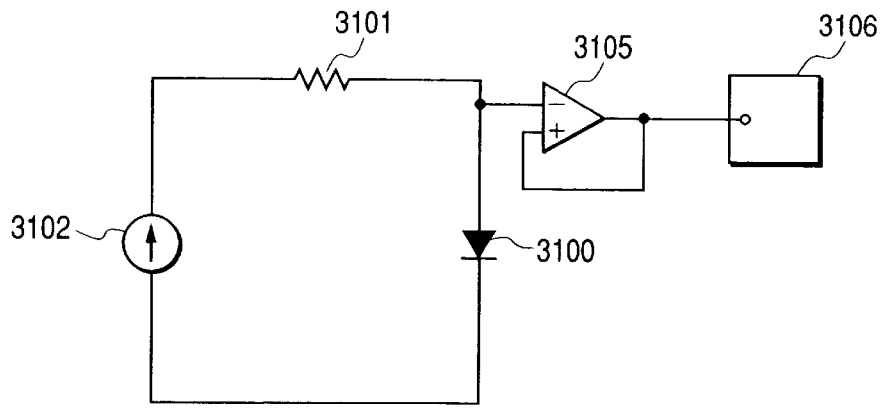
FIG. 12 is a circuit diagram showing a circuit for detecting variations in voltage of the semiconductor element member according to the present invention.

Next, means for detecting variations in the voltage signal etc. of the laser device will be described. As illustrated in FIG. 12, a constant current source 3102 is prepared and a semiconductor laser 3100 as a laser device is connected via a resistor 3101 to the current supply. Then an electric signal (a voltage signal in this case) of the semiconductor laser 3100 is read by a voltage detecting circuit 3106. It is preferable to provide a voltage follower 3105 as a protecting circuit, as illustrated in FIG. 12, as the occasion demands.

Figure 13:
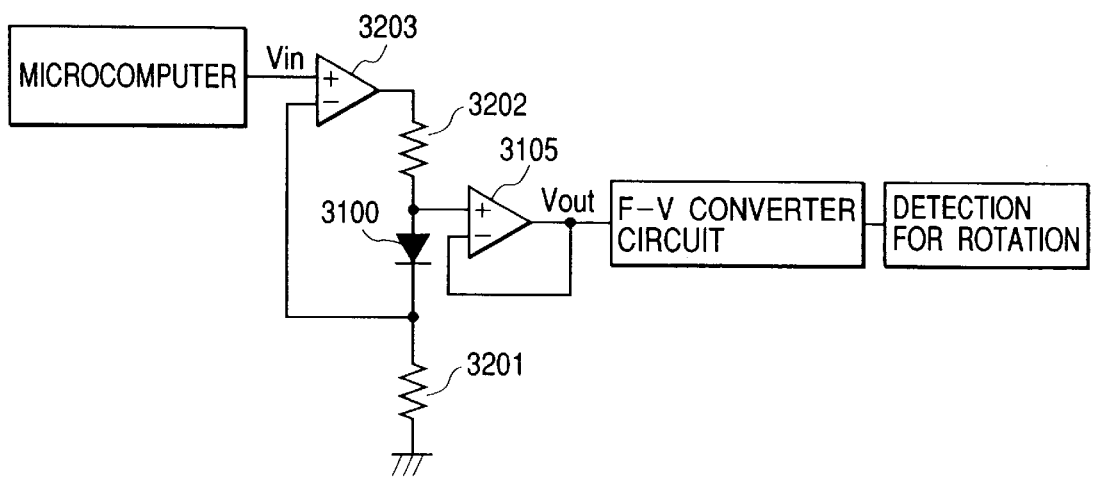
FIG. 13 is a circuit diagram showing another circuit for detecting variations in voltage of the semiconductor element member according to the present invention.

FIG. 13 shows an example of circuitry for driving the laser at constant current and reading variations in the anode potential of the semiconductor laser 3100 to detect rotation. The anode of the semiconductor laser 3100 is connected through a protection resistor 3202 to an output terminal of an operational amplifier 3203, while the cathode of the semiconductor laser 3100 to an inverting input terminal of the operational amplifier 3203. The operational amplifier 3203 outputs a signal Vout in accordance with an input potential Vin from a microcomputer. Since this signal Vout has the beat frequency proportional to the angular velocity, rotation can be detected by converting this signal into voltage by a known frequency–voltage converter (F–V converting circuit) or the like.

Figure 14:
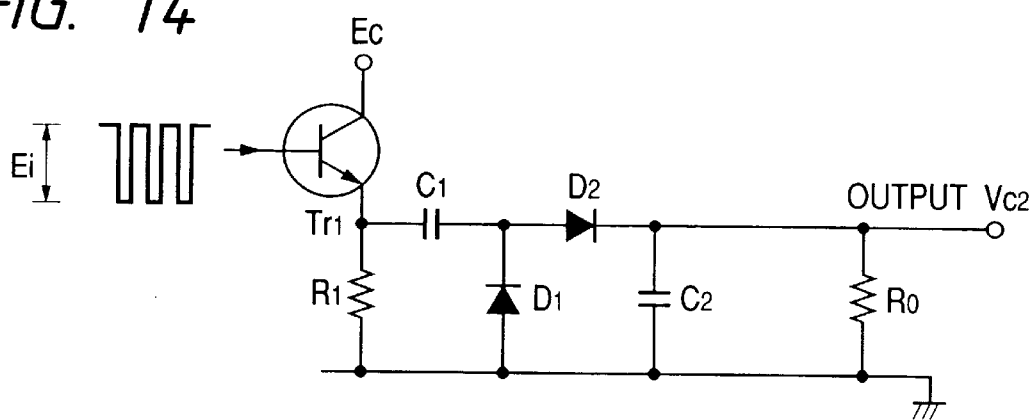
FIG. 14 is a circuit diagram showing an example of a frequency-voltage converter in the circuit for detecting variations in voltage of the semiconductor element member according to the present invention.

FIG. 14 shows an example of the frequency-voltage converter (F–V converting circuit). This circuit is composed of a transistor, diodes, capacitors, and resistors, and output voltage $V_{c2}$ thereof is expressed by the following equation.

$$V_{c2}=(E_i C_1 R_0 f)/[1+\{1/(1-\exp(-1/R_0 C_2 f))\}]$$

In the above equation, $E_i$ represents a peak-to-peak value of the input voltage and f the beat frequency. When the circuit parameters are designed so as to satisfy $C_2 \gg C_1$ and $R_0 C_2 f < 1$, the output voltage $V_{c2}$ expressed by the following equation is gained, so that the voltage output can be proportional to the beat frequency.

$$V_{c2}=(E_i C_1 R_0 f)/2$$

Figure 15:
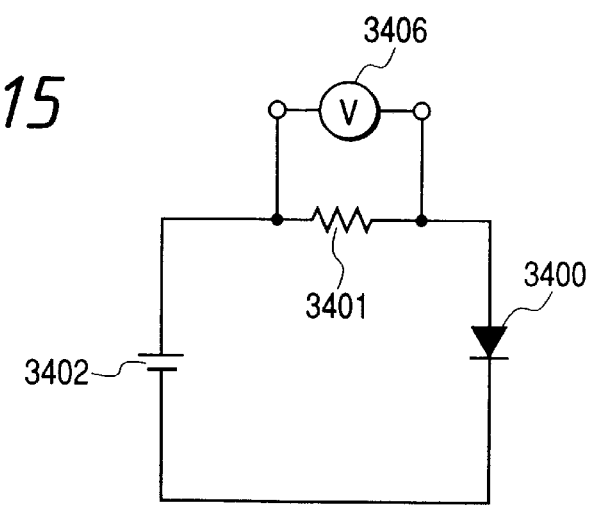
FIG. 15 is a circuit diagram showing a circuit for detecting variations in current of the semiconductor element member according to the present invention.
Figure 16:
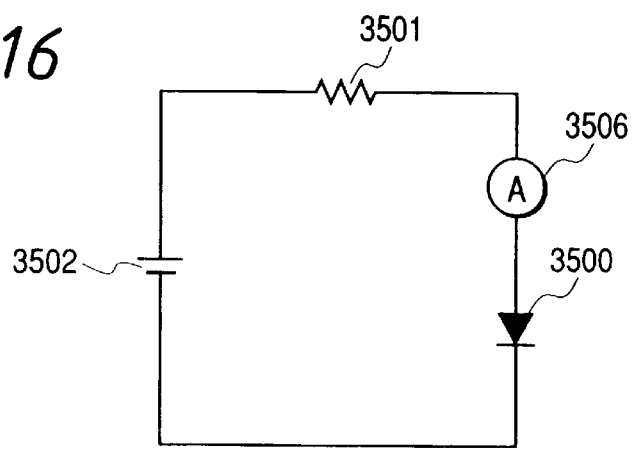
FIG. 16 is a circuit diagram showing another circuit for detecting variations in current of the semiconductor element member according to the present invention.

Next, an example of detecting the rotation by variations in current of the laser device will be described. With use of a constant voltage source as a power supply, the angular velocity of rotation can be measured as variations in the current flowing to the semiconductor laser. Use of a battery as a constant voltage supply, as illustrated in FIG. 15 or in FIG. 16, can contribute to size and weight reductions of the driving system. In FIG. 15 a resistor 3401 is connected in series to the semiconductor laser 3400 and the current flowing to the semiconductor laser is measured as variations in the voltage at the both ends of the resistor. Numeral 3402 designates the battery and 3406 a voltmeter. In contrast, in FIG. 16 an ammeter 3506 is connected in series to the semiconductor laser 3500 and directly measures the current flowing to the semiconductor laser. Numeral 3501 designates a resistor.

Figure 17:
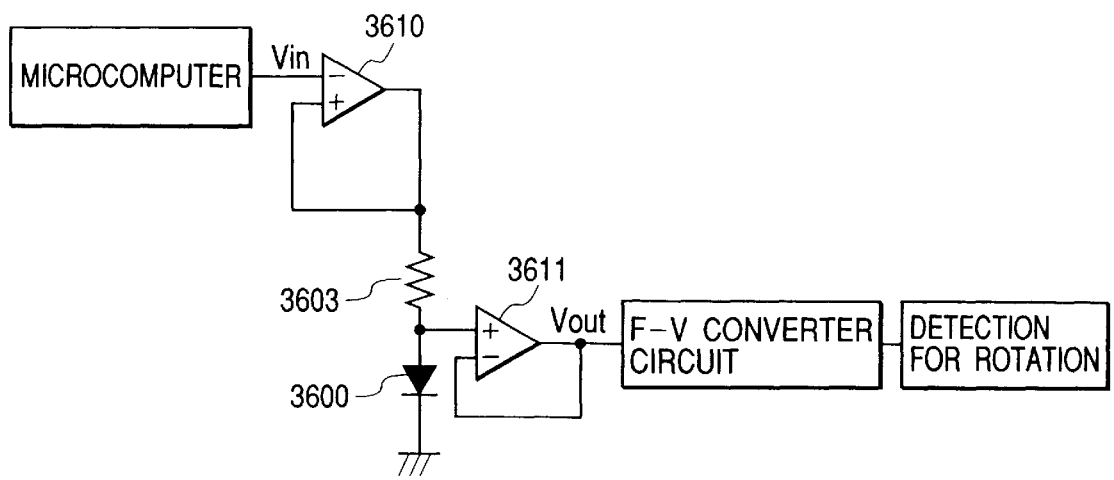
FIG. 17 is a circuit diagram showing another circuit for detecting variations in voltage of the semiconductor element member according to the present invention.

Next, another circuit configuration for detecting the beat signal will be described. FIG. 17 shows an example of circuitry for detection of rotation by driving the semiconductor laser at constant voltage and reading variations in the anode potential of the semiconductor laser 3600. The anode of the semiconductor laser 3600 is connected via a resistor 3603 to an output terminal of an operational amplifier 3610, while the cathode of the laser 3600 is grounded to a reference potential. When the constant voltage (Vin) is supplied from a microcomputer or the like to the inverting input terminal of the operational amplifier 3610, the potential is always applied on the resistor 3603 and laser 3600, thus forming a constant voltage drive configuration. The resistor 3603 is connected to a voltage follower 3611.

The voltage follower 3611 outputs the signal Vout. Since this signal Vout is the beat frequency signal proportional to the angular velocity, the rotation is detected by converting it into voltage by a known frequency–voltage converter (F–V converting circuit) or the like. It is a matter of course that the signal of the same potential as that of the resistor 3603 can be guided directly into the F–V converter without intervention of the voltage follower 3611, thereby detecting the rotation. A frequency counter may also be used as a beat signal detector.

Figure 18:
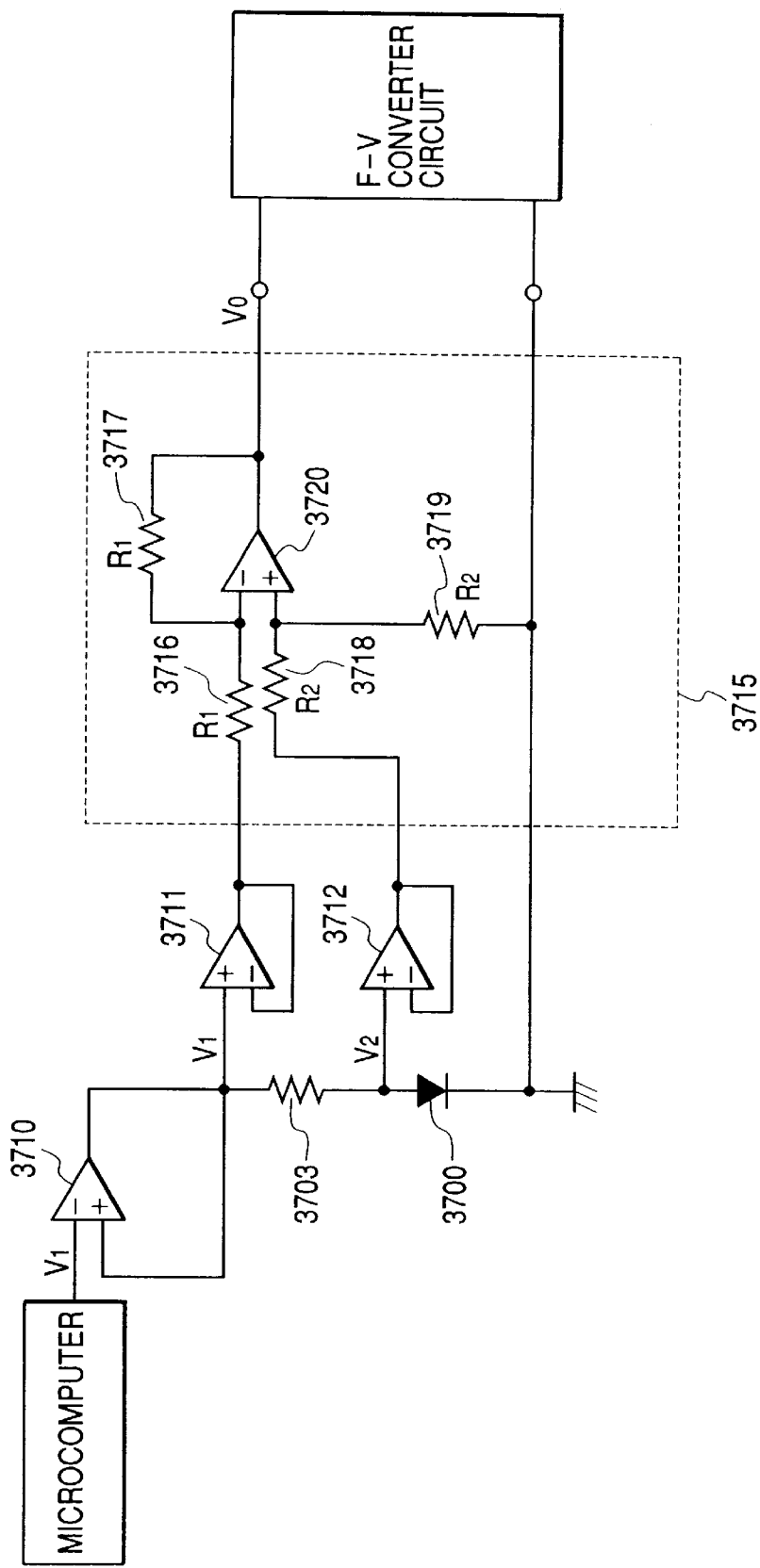
FIG. 18 is a circuit diagram showing another circuit for detecting variations in voltage of the semiconductor element member according to the present invention.
Figure 20A:
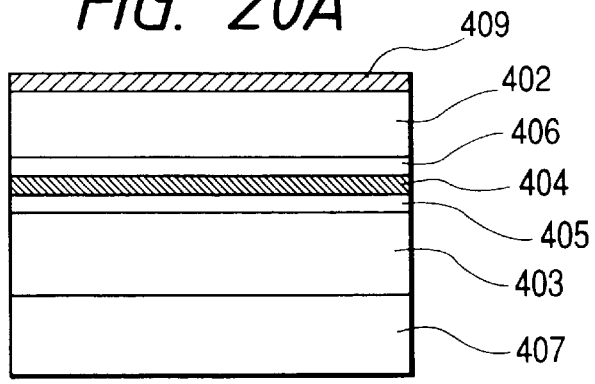
FIGS. 20A, 20B and 20C are diagrams for explaining the prior art example.
Figure 20B:
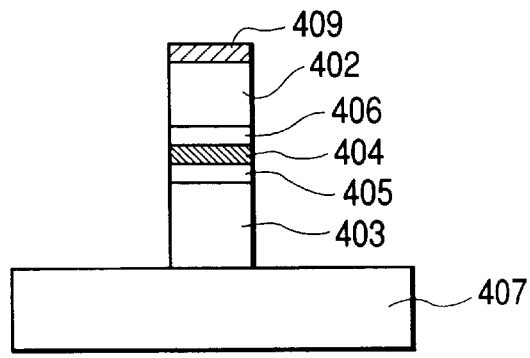
Figure 20C:
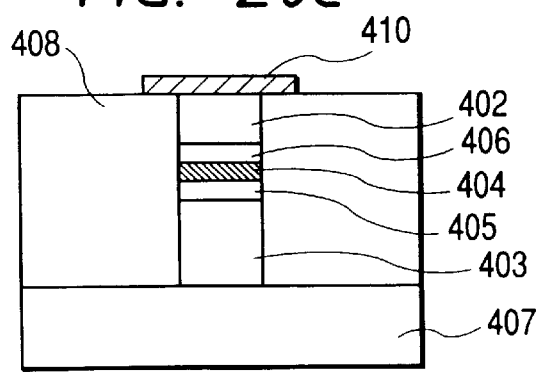

Next, FIG. 18 shows an example in which the reference of the signal potential is the earth with use of a subtractor 3715 in addition to the same constant voltage drive circuit configuration as in FIG. 17. The constant potential $V_1$ is supplied from the microcomputer or the like to the inverting input terminal of the operational amplifier 3710. Numeral 3700 represents the laser, 3711 and 3712 do voltage followers, 3703, 3716, and 3719 resistors, resistors 3716 and 3717 having an equal resistance, and resistors 3718 and 3719 having an equal resistance.

Potentials $V_1$, $V_2$ at the both ends of the resistor 3703 are coupled through the respective voltage followers 3711, 3712 and resistors 3716, 3718 to the inverting input terminal and to the non-inverting input terminal of the operational amplifier 3720, respectively. This configuration allows the reference potential to be set to the earth and the circuit to detect variations in the voltage ($V_2-V_1=V_0$) applied on the resistor 3703. Namely, it can detect the variations in the current flowing to the laser 3700. The rotation is detected by converting the obtained signal to the voltage by the F–V converter or the like.

Figure 19:
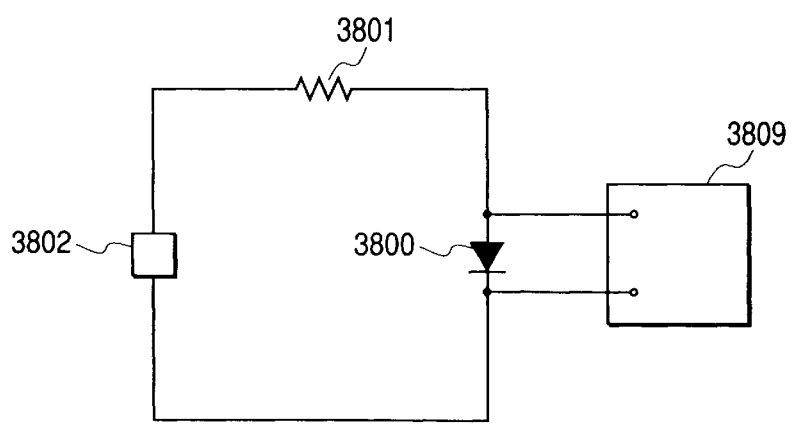
FIG. 19 is a circuit diagram showing a circuit for detecting variations in impedance of the semiconductor element member according to the present invention.

It is also possible to measure variations in the impedance of the semiconductor laser 3800 directly by an impedance meter 3809, irrespective of the types of the power supply. Numeral 3801 denotes a resistor and 3802 a power supply. In this case, unlike the cases of measuring the terminal voltage or the current flowing to the device, there occurs less influence from the noise of the driving power supply. This example is presented in FIG. 19.

Example 4

The fourth example will be described with reference to FIGS. 10A to 10G. Described herein is an example in which a ridge laser was produced using a semiconductor laser substrate having a stack of InP and InGaAsP layers. Prepared was a semiconductor substrate having a stack of an n-InP cladding layer 502, an InGaAsP guiding layer 504, a non-doped multiple quantum well (MQW) active layer 506 consisting of InGaAsP and InGaAs, a p-InGaAsP guiding layer 508, a p-InP cladding layer 510, and a p-InGaAsP cap layer 512 which were deposited in the stated order on an n-InP substrate 500. A positive photoresist containing a novolak resin as a main component was applied onto the semiconductor substrate by spin coating and a resist mask 514 was formed in the stripe shape having the width of 5 $\mu$m and the height of 1.5 $\mu$m by photolithography.

Figure 10A:
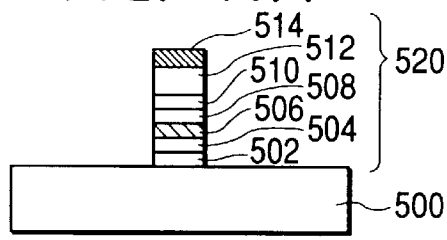
FIGS. 10A, 10B, 10C, 10D, 10E, 10F and 10G are views for explaining a fourth example.

Then dry etching was carried out using this etching mask 514 to form a ridge portion 520, as illustrated in FIG. 10A.

In the present example the etching system used was the reactive ion beam etching (RIBE) system with the electron cyclotron resonance (ECR) plasma and the etching gas was chlorine gas. After the etching chamber of the ECR-RIBE system was evacuated down to the vacuum of $3\times10^{-6}$ Pa by the turbo molecular pump, etching was conducted under the flow of chlorine gas at 3 sccm and under the conditions of the internal pressure of the chamber of $1\times10^{-2}$ Pa, the ECR plasma power of 200 W, the substrate temperature of 280° C., and the acceleration voltage of 650 V. These etching conditions were selected as conditions to gain the etching shape with high verticality for the InP-base compound semiconductors. Under these conditions the ridge was created by etching the layers including the n-InP cladding layer 502. At this time the height of the ridge was approximately 2 $\mu$m. The method, conditions, etc. of the dry etching do not have to be limited to those described in the present example, but may also be selected properly according to the materials to be etched, the device to be fabricated, and so on.

Figure 10E:
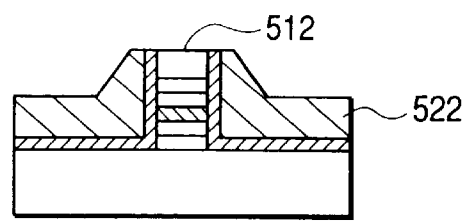
Figure 10B:
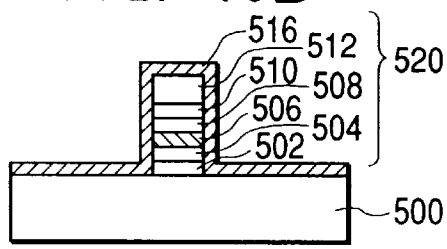

Next, the resist mask 514 for the dry etching was removed by ashing with an oxygen plasma, as illustrated in FIG. 10B. After that, a silicon nitride layer was deposited as a passivation film 516 in the thickness of 194 nm by plasma CVD.

Figure 10F:
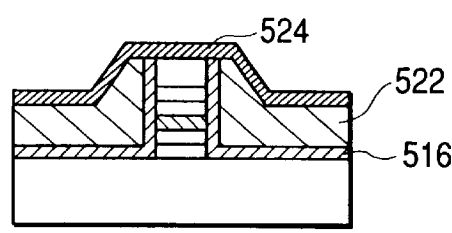
Figure 10C:
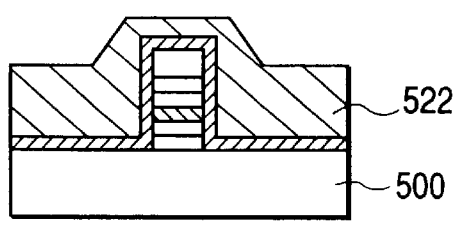

After that, as illustrated in FIG. 10C, a negative photoresist 522 consisting of the polyvinylphenol resin and the bis azido compound was applied onto the entire surface by spin coating at 3000 rpm with the spinner and the sample was heated at 80° C. for five minutes by the hot plate to volatilize the solvent of the photoresist, thus embedding the ridge therein. At this time, the thickness of the photoresist in the flat part was 1.2 $\mu$m.

Figure 10G:
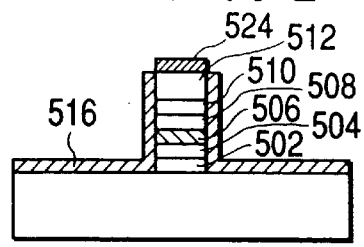
Figure 10D:
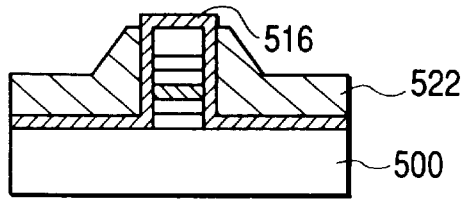

Then ashing with an oxygen plasma was conducted under the ashing conditions of the etching pressure of 3 Pa and the RF power of 130 W for three minutes in order to expose only the upper surface of the projection, as illustrated in FIG. 10D. After that, the surface was observed with the optical microscope and it was recognized that the passivation film 516 was exposed almost perfectly above the upper surface of the ridge.

After that, etching was conducted with an etching gas of $CF_4$ and at the RF power of 130 W for three minutes in order to remove the exposed passivation film, as illustrated in FIG. 10E, and it was confirmed that the passivation film on the upper surface of the ridge was removed so as to expose the semiconductor layer there. In the present example the passivation film was removed by RIE using $CF_4$ as etching gas, but it is a matter of course that the passivation film can also be removed by wet etching using hydrofluoric acid or the like.

Then, in the exposed state of the semiconductor layer at the upper surface of the ridge, titanium and gold as an electrode material 524 were deposited successively in the thickness of 10 nm and in the thickness of 100 nm, respectively, over the entire surface by electron beam evaporation, as illustrated in FIG. 10F.

Then, when this sample was immersed in acetone and ultrasonic cleaning was carried out for five minutes, the photoresist 522 having covered the ridge was removed completely together with the excessive electrode material, so that all the electrode material on the portions except for the region above the ridge could be removed, as illustrated in FIG. 10G.

Finally, a titanium layer 50 nm thick and a gold layer 500 nm thick were deposited as an electrode on the back surface by electron beam evaporation, thus completing the element.

Example 5

An example of production of a surface emitting laser will be described as a fifth example of the present invention with reference to FIGS. 11A to 11G.

Figure 11A:
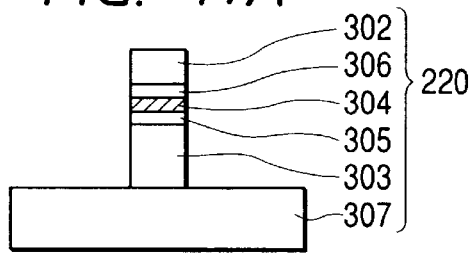
FIGS. 11A, 11B, 11C, 11D, 11E, 11F and 11G are views for explaining a fifth example.

As illustrated in FIG. 11A, the cylindrical structure having the diameter of 10 $\mu$m was created by the known techniques. In this figure numeral 307 denotes a substrate, 303 a lower multilayer reflector, 305 a spacer layer, 304 an active layer, 306 a spacer layer, and 302 an upper multilayer reflector. At this time, the height of the cylinder was approximately 4 $\mu$m.

Figure 11E:
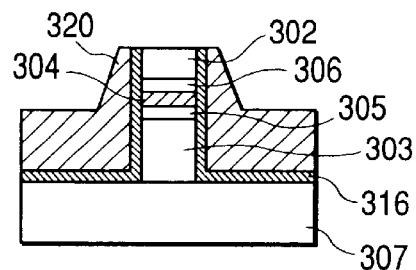
Figure 11B:
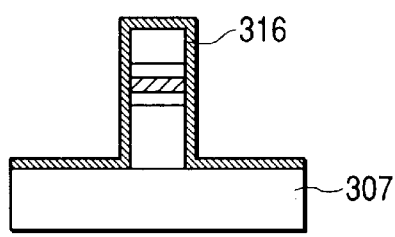

Then a silicon nitride layer as a passivation film 316, which was a protective layer, was deposited in the thickness of 200 nm by plasma CVD, as illustrated in FIG. 11B.

Figure 11F:
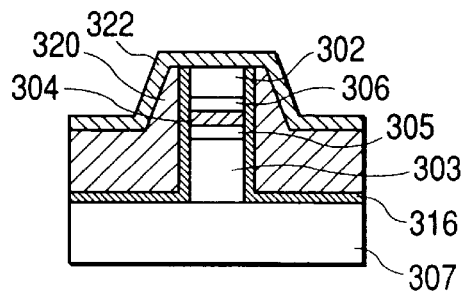
Figure 11C:
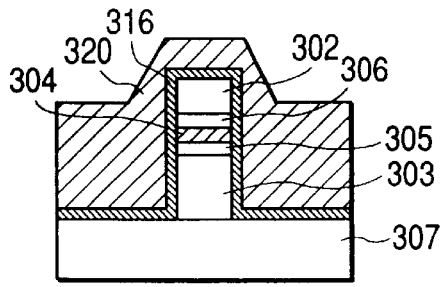

Then, as illustrated in FIG. 11C, the negative photoresist 320 consisting of the polyvinylphenol resin and the bis azido compound was applied onto the entire surface by spin coating at the rotational speed of 2000 rpm with the spinner, and the sample was heated at 80° C. for five minutes by the hot plate to volatilize the solvent of the photoresist, thereby embedding the cylinder.

Figure 11G:
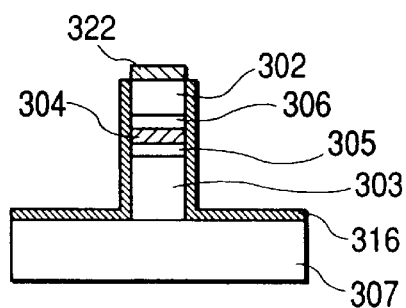
Figure 11D:
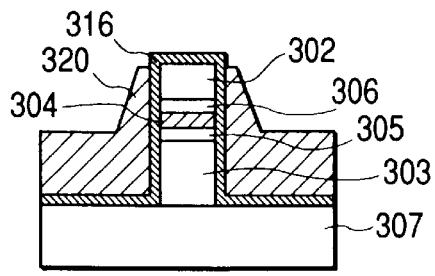

Then ashing with an oxygen plasma was conducted in order to expose only the silicon nitride film as the passivation film 316 on the upper surface of the projection, thereby etching the photoresist uniformly, as illustrated in FIG. 11D. By the ashing under the etching pressure of 3 Pa and the RF power of 130 W for five minutes, the silicon nitride film was exposed at the top part of the cylinder.

After that, the RIE of the exposed silicon nitride film was conducted using $CF_4$ as etching gas, as illustrated in FIG. 11E. The etching was conducted under the etching pressure of 4 Pa and the RF power of 130 W for four minutes, whereby the silicon nitride film was removed from the top part of the cylinder. In the present example the silicon nitride film was removed by the RIE using $CF_4$ as etching gas, but it is a matter of course that it can also be removed by wet etching using hydrofluoric acid or the like.

Then a Cr layer and an Au layer were deposited as an electrode material 322 in the thickness of 50 nm and in the thickness of 500 nm, respectively, over the entire surface by electron beam evaporation, as illustrated in FIG. 11F.

Then, when this sample was immersed in acetone and ultrasonic cleaning was conducted for ten minutes, the photoresist 320 was peeled off completely and the electrode material was removed all from the portions except for the top part of the cylinder, as illustrated in FIG. 11G.

Finally, an electrode was formed on the back surface except for the light output portion, thus completing the element.

As described above, the present invention permits the electrode and the passivation film to be formed on the upper surface of the microscopic projection by self-alignment without use of the photolithography process requiring alignment and also permits the semiconductor elements having such structure with the electrode formed on the microscopic projection to be produced at a high yield.

The present invention also permits the passivation film to be formed selectively on the side surface of the semiconductor element member having the projected region, without the need for highly accurate alignment.

What is claimed is:

1. A method of producing a semiconductor element, comprising:
   a step of preparing a semiconductor element member comprising on a substrate a projection region having an electrode material formed on an upper surface thereof;
   a step of forming a first passivation film on an upper surface of the substrate, and an upper surface and a side surface of the projection region;
   a step of forming a second passivation film on the first passivation film;
   an exposure step of removing the second passivation film on the upper surface of the projection region to expose the first passivation film, the remaining second passivation film having a portion with an inclined surface;
   a step of removing the first passivation film on the upper surface of the projection region; and
   a step of removing the remaining second passivation film on the first passivation film.

2. The method according to claim 1, wherein the second passivation film remaining on the upper surface of the substrate is removed while removing the second passivation film remaining on the side surface of the projection region.

3. The method according to claim 1, wherein the semiconductor element member comprises an electrode layer on an upper surface thereof.

4. The method according to claim 1, wherein the first passivation film is a material selected from the group consisting of $SiO_2$, MgO, and $SIN_x$.

5. The method according to claim 1, wherein the second passivation film is a resin.

6. The method according to claim 1, wherein the step of forming the second passivation film is carried out by spin coating of a potting material onto the substrate.

7. The method according to claim 1, wherein the exposure step is carried out by removing the second passivation film on the upper surface of the projection by plasma etching.

8. The method according to claim 1, wherein the thickness of the second passivation film formed on the upper surface of the projection region is smaller than the thickness of the second passivation film formed on the upper surface of the substrate.

9. The method according to claim 1, wherein the shape of the semiconductor element member is a mesa shape or a ridge shape.

10. The method according to claim 1, wherein the semiconductor element member comprises an active layer and cladding layers sandwiching the active layer.

11. A method of producing a semiconductor element, comprising:
    a step of preparing a semiconductor element member comprising on a substrate a projection region having an electrode material formed on an upper surface thereof;
    a step of forming a first passivation film on an upper surface of the substrate, and an upper surface and a side surface of the projection region;
    a step of forming a second passivation film on the first passivation film, the second passivation film having a portion with an inclined surface;
    an exposure step of removing the second passivation film on the upper surface of the projection region to expose the first passivation film;
    a step of removing the first passivation film on the upper surface of the projection region; and
    a step of removing the remaining second passivation film on the first passivation film.

* * * * *